(12) United States Patent
Kub et al.

(10) Patent No.: US 6,607,969 B1
(45) Date of Patent: Aug. 19, 2003

(54) METHOD FOR MAKING PYROELECTRIC, ELECTRO-OPTICAL AND DECOUPLING CAPACITORS USING THIN FILM TRANSFER AND HYDROGEN ION SPLITTING TECHNIQUES

(75) Inventors: Francis J. Kub, Arnold, MD (US); Karl D. Hobart, Upper Marlboro, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/098,321

(22) Filed: Mar. 18, 2002

(51) Int. Cl.[7] .................. H01L 21/30; H01L 21/46; H01L 21/4763; H01L 21/00

(52) U.S. Cl. ................. 438/458; 438/619; 438/54; 156/344; 156/384

(58) Field of Search ................ 438/3, 455–459, 438/54–55, 797–798; 156/344, 584

(56) References Cited

U.S. PATENT DOCUMENTS

| | | | |
|---|---|---|---|
| 4,013,983 A | 3/1977 | Hartemann | |
| 4,062,105 A | 12/1977 | Day | |
| 5,298,748 A | * 3/1994 | Kenny et al. | 250/338.1 |
| 5,374,564 A | 12/1994 | Bruel | |
| 5,391,257 A | 2/1995 | Sullivan et al. | |
| 5,401,544 A | 3/1995 | Nakahata et al. | |
| 5,446,330 A | 8/1995 | Eda et al. | |
| 5,448,126 A | 9/1995 | Eda et al. | |
| 5,630,949 A | 5/1997 | Lakin | |
| 5,654,229 A | * 8/1997 | Leplingard et al. | 117/56 |
| 5,714,395 A | 2/1998 | Bruel | |
| 5,811,851 A | * 9/1998 | Nishioka et al. | 257/310 |
| 5,877,070 A | 3/1999 | Goesele et al. | |
| 5,882,987 A | 3/1999 | Srikrishnan | |
| 5,966,620 A | 10/1999 | Sakaguchi et al. | |
| 5,993,677 A | 11/1999 | Biasse et al. | |
| 5,994,207 A | 11/1999 | Henley et al. | |
| 6,010,579 A | 1/2000 | Henley et al. | |
| 6,020,252 A | 2/2000 | Aspar et al. | |
| 6,054,370 A | 4/2000 | Doyle | |
| 6,103,597 A | 8/2000 | Aspar et al. | |
| 6,120,597 A | 9/2000 | Levy et al. | |
| 6,328,796 B1 | 12/2001 | Kub et al. | |
| 6,333,202 B1 | * 12/2001 | Adkisson et al. | 438/3 |
| 6,352,909 B1 | * 3/2002 | Usenko | 438/458 |
| 6,391,658 B1 | * 5/2002 | Gates et al. | 438/3 |
| 6,391,799 B1 | * 5/2002 | Di Cioccio | 438/781 |
| 2002/0066525 A1 | * 6/2002 | Wada et al. | 156/235 |
| 2002/0072245 A1 | * 6/2002 | Ooms et al. | 438/758 |
| 2002/0096106 A1 | * 7/2002 | Kub et al. | 117/94 |

OTHER PUBLICATIONS

L.J. Hunag, Q.Y. Tong, U. Gosele, Hydrogen–Implantation Induced Blistering And Layer Transfer Of LaAlO3 And Sapphire, Electrochemical and Solid–State letters, 2 (5)238–239 (1999), c The Electrochemical Society, Inc.

(List continued on next page.)

*Primary Examiner*—John F. Niebling
*Assistant Examiner*—Viktor Simkovic
(74) *Attorney, Agent, or Firm*—John J. Karasek; Rebecca L. Forman

(57) ABSTRACT

A method for making a thin film device or pyroelectric sensor is provided. A film layer of thin film functional material is grown on a large diameter growth substrate. One or more protective layers may be deposited on the surface of the growth substrate before the thin film functional material is deposited. Hydrogen is implanted to a selected depth within the growth substrate or within a protective layer to form a hydrogen ion layer. The growth substrate and associated layers are bonded to a second substrate. The layers are split along the hydrogen ion implant and the portion of the growth substrate and associated layers that are on the side of the ion layer away from the second substrate are removed.

1 Claim, 10 Drawing Sheets

OTHER PUBLICATIONS

F.J. Kub, K.D. Hobart, J.M. Pond, S.W. Kirchoefer, Single–Crystal Ferroelectric Microwave Capacitor Fabricated By Separation By Hydrogen Implantation, Electronics Letters, Mar. 18, 1999, vol. 35, No.6.

K.D. Hobart, F.J. Kub, G.G. Jernigan, M.E. Twigg, P.E. Thompson, Fabrication Of SOI Substrates With Ultra–Thin Si Layers, Electronics Letters, Jun. 11, 1998, vol. 34, No. 12.

K.D. Hobart, F.J. Kub, Transfer Of GaSb Thin Film To Insulating Substrate Via Separation by Hydrogen Implantation, electronics Letters, Apr. 15, 1999, vol. 35, No. 8.

M. Bruel, Silicon On Insulator Material Technology, Electronics Letters, Jul. 6, 1995, vol. 31, No. 14.

Q.Y. Tong, K. Gutjahr, S. Hopfe, U. Gosele, T.H. Lee, Layer Splitting Process In Hydrogen–Implanted Si, Ge, SiC, And Diamond Substrates, Jan. 10, 1997, c. American Institute Of Physics, 3 Pages.

B. Aspar, H. Moriceau, E. Jalaguier, C. Lagahe, A. Soubie, B. Biasse, A.M. Papon, A. Claverie, J. Griscolia, G. Benassayag, F. Letertre, O. Rayssac, T. Barge, C. Maleville, B. Ghyselen, The Generic Nature f The Smart–Cut Process For Thin Film Transfer, Journal of Electronic Materials, vol. 30, No. 7, 2001.

F.J. Kub, K.D. Hobart, Method For Making Shallow diffusion Junctions In Semiconductor Using Elemental Doping, NC 79,596, Ser. 09/964,545, Filed Sep. 28, 2001, Patent Pending.

F.J. Kub, K.D. Hobart, Method For Manufacturing A Semiconductor Device Having A Thin GaN Material Directly Bonded To An Optimized Substrate, NC 79,313, Ser. # 09/964,546, Filed Sep. 28, 2001, Patent Pending.

F.J. Kub, K.D. Hobart, Method For Making Electro–Optical Devices Using Hydrogen Using Ion Splitting Technique, NC 79,639, Ser. # 09/985,958, Filed Oct. 29, 2001, Patent Pending.

F.J. Kub, K.D. Hobart, Method for Transferring Thin Film Layer Material To A Flexible Substrate Using A Hydrogen Ion Splitting Technique, NC 79,684, Ser. # 09/022,364, Filed Dec. 20, 2001, Patent Pending.

F. Kub, K. Hobart, M. Spencer, Method Of Making Mosaic Array Of Thin Semiconductor Material On Large Substrates, NC 79,225, Ser. # 10/046,534, Filed Jan. 16, 2002, Patent Pending.

F.J. Kub, K.D. Hobart, Method For Making Piezoelectric Resonator And Surface Acoustic Wave Device Using Hydrogen Implant Layer Splitting, NC 79,598, Filed Apr. 22, 2002, Patent Pending.

F.J. Kub, K.D. Hobart, Method of Transferring Thin Film Functional Material To A Semiconductor Substrate Or Optimized Substrate Using A Hydrogen Ion Splitting Technique, NC 79,682, Filed Mar. 29, 2002, Patent Pending.

* cited by examiner

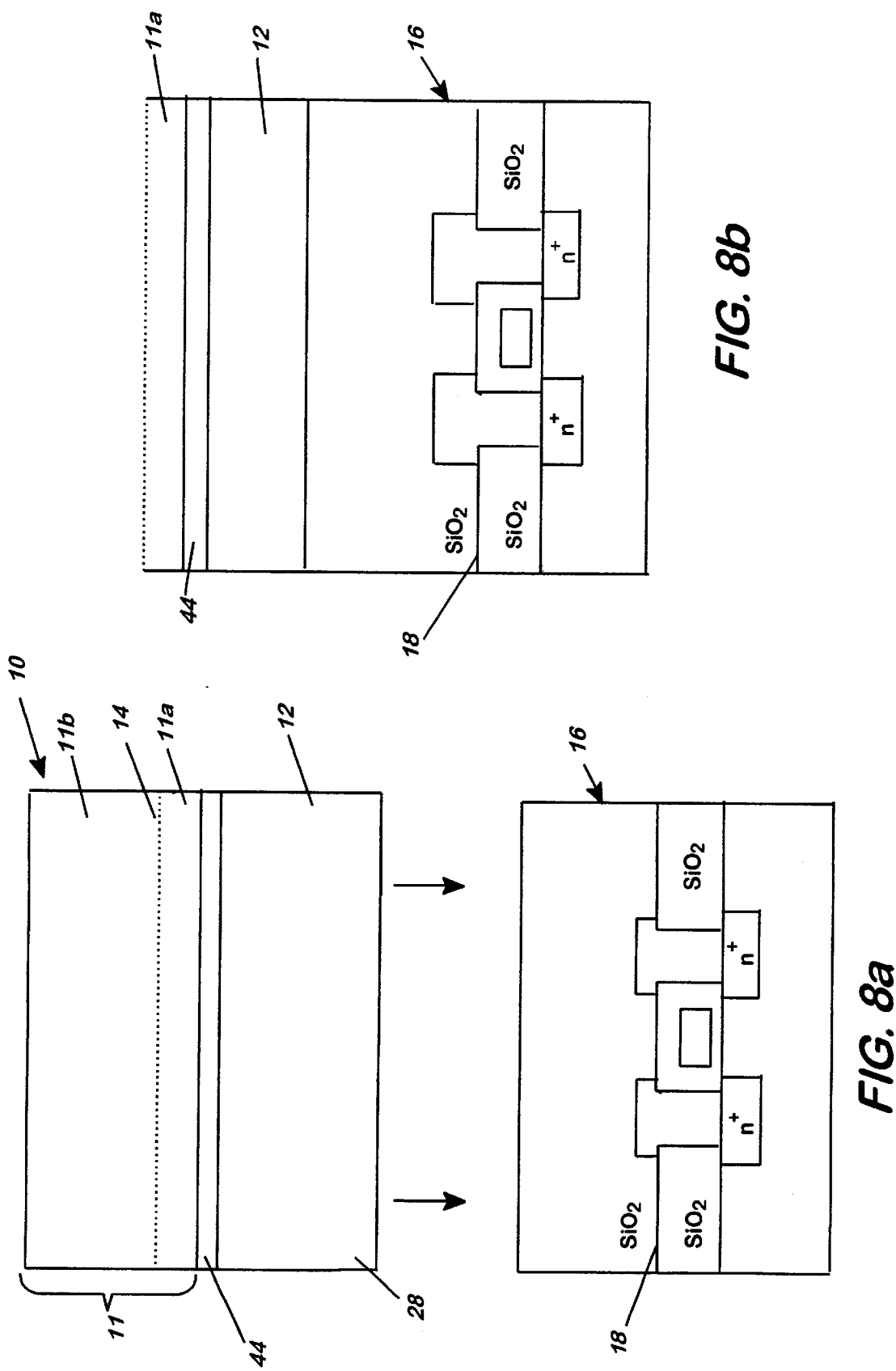

METHOD FOR MAKING PYROELECTRIC, ELECTRO-OPTICAL AND DECOUPLING CAPACITORS USING THIN FILM TRANSFER AND HYDROGEN ION SPLITTING TECHNIQUES

BACKGROUND OF THE INVENTION

1. Field of the Invention

The present invention relates to the manufacture of capacitors and pyroelectric sensors, and more particularly, the invention relates to a method for manufacturing capacitors and pyroelectric sensors by transferring thin film material layers using hydrogen ion splitting technology.

2. Background of the Invention

There is much interest in the art in cost-effective ways to improve the manufacture of electrical devices such as capacitors and pyroelectric sensors. These devices are often made by placing thin film functional materials over CMOS or GaAs semi-conductor circuitry, or another suitable substrate. The thin film materials are typically ferroelectric, piezoelectric, pyroelectric, thermoelectric, high dielectric constant, electro-optic, photoreactive, wave guide, non-linear optical, superconducting, photodetecting, wide bandgap, electrically conducting, or have other desired qualities.

The thin film materials can be used for such devices as capacitors, high dielectric constant decoupling capacitors for power supplies, tunable microwave capacitors, pyroelectric un-cooled infrared imagers, boulometer infrared sensors, uncooled infrared detectors, cryogenic infrared detectors, and photodetectors.

To obtain high quality thin film material, the material is typically grown on a substrate at a growth temperature or annealing temperature of 500° C. to 1100° C. The high growth temperature is required to assure a high quality thin film material.

However, the highest temperature that a substrate containing CMOS integrated circuit technology can withstand, especially when metal interconnectors between circuitry layers are in place, is typically 450° C. to 500° C. Therefore, it is generally not possible to obtain the best quality thin film material by growing the material directly on a CMOS substrate.

An optimal solution is to grow the thin film material on a first, or growth, substrate, such as silicon, that can withstand the increased temperatures and then transfer the thin film material after it is grown to a second, or application, substrate such as the CMOS circuitry herein for use. However, there have been problems with isolating, and then transferring, the thin film layer. If the growth substrate is chemically or plasma etched away, mechanically or thinned using lappling and grinding, the risk of damage to the thin film layer during this process is considerable. Further, some growth substrate materials are very expensive, and elimination of the substrate to isolate the thin film layer is cost prohibitive. Once the thin film layer is separated from the growth substrate, there is a second problem. The thin film layer must have a smooth surface for the transition and bonding to the second substrate to be successful. Otherwise, the bond may not hold properly, and the device will not function optimally.

There have been attempts in the prior art to address this issue. Prior art of interest includes U.S. Pat. No. 6,120,597 to Levy et al.; U.S. Pat. No. 6,103,597 to Aspar et al.; U.S. Pat. No. 6,020,252 to Aspar et al.; U.S. Pat. No. 5,994,207 to Henley et al.; U.S. Pat. No. 5,993,677 to Biasse et al.; U.S. Pat. No. 5,966,620 to Sakaguchi et al.; U.S. Pat. No. 5,877,070 to Goesele et al.; and U.S. Pat. No. 5,654,583 to Okuno et al.

The Levy et al, Aspar et al ('597), Aspar et al ('252), Henley et al. ('207), Biasse, Sakaguchi et al., and Goesele et al. patents each disclose methods which utilize, to some extent, ion implantation, wafer bonding, and layer splitting for the transfer of semiconductor films to second substrates. For example, the Levy et al patent discloses a method of crystal ion slicing of single-crystal films, which is particularly useful in connection with metal oxide films and crystal structures. The Biasse et al. patent discloses a method for transferring a thin film from an initial substrate to a final substrate by joining the thin film to a handle substrate, cleaving the initial substrate, joining the thin film to a final substrate, and cleaving the handle substrate. The Goesele et al. patent discloses a method of transferring thin monocrystalline layers to second substrates at lower temperatures than previously possible. The Okuno et al. patent discloses a method for direct bonding different semiconductor structures in order to form a unified semiconductor device. However, these prior art references fail to provide a satisfactory answer to the problems of isolating and transferring the thin film layer described herein.

SUMMARY OF THE INVENTION

In accordance with the invention, a method is provided for fabricating capacitors and pyroelectric sensors by transferring thin film layers with the use of a hydrogen ion splitting technique.

In one embodiment, the method comprises the steps of optionally depositing at least one protective layer on one surface of a large diameter growth substrate; growing a film layer of thin film functional material on the at least one protective layer, the functional material comprising a material selected from the group consisting of ferroelectric, piezoelectric, pyroelectric, thermoconductive, high dielectric, electro optic, photorefractive, wave guide, non-linear optical, superconducting, photodetecting, wide bandgap, and electrically conducting materials; implanting hydrogen to a selected depth within the growth substrate or within the at least one protective layer to form a hydrogen ion layer so as to divide the material having the growth substrate and the at least one protective layer into distinct portions; bonding the growth substrate including the at least one protective layer and the thin film layer to a second substrate; splitting the material having the growth substrate and the at least one protective layer along the implanted ion layer and removing the portion of the material which is on the side of the ion layer away from the second substrate.

Preferably, the second substrate comprises silicon; the at least one protective layer further comprises an oxide layer, an adhesion layer, and a barrier layer; and the method further comprises the steps of; depositing the oxide layer on the silicon substrate for isolating the silicon substrate; depositing the adhesion layer on the oxide layer, wherein the adhesion layer is comprised of titanium; and depositing the barrier layer on the titanium adhesion layer for isolating the thin film layer, wherein the barrier layer comprises a material selected from a group consisting of platinum and iridium.

Advantageously, the barrier layer further comprises platinum and has a thickness of about 100 nm; the titanium adhesion layer has a thickness of about 50 nm; and the oxide layer further comprises silicon oxide and has a thickness of about 100 nm. Alternatively, the at least one protective layer further comprises MgO.

Advantageously, the method further comprises the step of implanting boron at the same selected depth as the implanted hydrogen for lowering the thermal energy required to split the growth substrate.

Preferably, the method further comprises the step of depositing at least one layer of metal on the thin film layer before the bonding step.

Advantageously, the at least one layer of metal comprises a metal selected from a group consisting of gold, palladium, platinum and nickel. Alternatively, the at least one layer of metal further comprises a layer of chrome, and a layer selected from the group consisting of gold and silver.

Preferably, the bonding step is carried out by bump bonding, and further comprises the step of depositing a layer of stiffener material on the thin film layer for providing mechanical support to the thin film layer.

Advantageously, the stiffener material comprises gold having a thickness of about 20 um.

Preferably, a portion of the second substrate comprises a type of circuitry selected from one of a group consisting of GaAs circuitry and CMOS circuitry.

Advantageously, the method further comprises the steps of depositing a layer comprising silicon on the surface of the second substrate before the bonding step, and fabricating at least one conductive connection from the circuitry to the layer of silicon at the surface of the second substrate.

Preferably, the method further comprises the steps of depositing a layer comprising a metal on the surface of the second substrate, and fabricating at least one conductive connection from the circuitry to the metal layer on the surface of the second substrate.

Advantageously, the second substrate is comprised of a material selected from a group consisting of glass, quartz, poly-SiC, GaAs, silicon, diamond, and sapphire.

Preferably, the method further comprises the step of annealing the thin film layer for strengthening and tempering the thin film layer, and wherein the anneal is carried out at a temperature of about 600° C. to about 1100° C.

Advantageously, the thin film layer comprises a material selected from a group consisting of nanoparticles, PZT, SrBaTiO3, PLZT and LiNbO3.

Preferably, the thin film layer comprises a material selected from a group consisting of SiGe, GaAs, CdTe/HgCdTe, ZnO and GaN.

Advantageously, the large diameter growth substrate comprises a material selected from a group consisting of silicon, GaAs, sapphire and quartz.

Preferably, the large diameter growth substrate comprises silicon.

Preferably, the second substrate further comprises a material selected from a group consisting of silicon, glass, quartz, poly-SiC, GaAs, diamond, and sapphire.

In an alternative embodiment, the film layer of thin film functional material is grown directly on the surface of the growth substrate. The hydrogen ion layer is implanted within the growth substrate, and the growth substrate is split along the implanted ion layer.

Yet another embodiment is provided for making a pyroelectric sensor, comprising the steps of: depositing at least one protective layer on the surface of a growth substrate; growing a layer of pyroelectric thin film functional material on the at least one protective layer; implanting hydrogen to a selected depth within the growth substrate or within the at least one protective layer to form a hydrogen ion layer so as to divide the material having the growth substrate and the at least one protective layer into distinct portions; depositing at least one layer of metal on the pyroelectric thin film layer; providing a conductive connection between the material having the thin film layer, and a second substrate, the second substrate comprising circuitry; splitting the material having the growth substrate and the at least one protective layer along the implanted ion layer and removing the portion of the material which is on the side of the ion layer away from the second substrate.

Preferably, the method, further comprises the step of depositing a membrane layer on the at least one metal layer.

Advantageously, the membrane layer further comprises a nitride, and the method further comprises the step of removing a quantity of dielectric material from the nitride membrane.

Preferably, the method further comprises the step of providing a vacuum between the growth substrate and the second substrate.

Advantageously, providing the conductive connection is carried out by fabricating a conductive connection between the circuitry of the second substrate and the at least one metal layer. Alternatively, providing the conductive connection is carried out by fabricating a conductive connection between the second substrate circuitry and the second substrate surface; depositing a conductive layer on the surface of the second substrate, wherein the conductive layer is in contact with the conductive connection; and fabricating at least one post extending from the conductive layer to the metal layer for thermally insulating the CMOS or GaAs circuitry from the thin film pyroelectric layer, the at least one post comprising a material selected from one of a group consisting of a conductive epoxy, amorphous silicon, and InSnO.

In an alternative embodiment, the layer of pyroelectric thin film functional material is grown on the surface of the growth substrate; the hydrogen is implanted within the growth substrate, and the growth substrate is split along the implanted ion layer.

Other features and advantages of the invention will be set forth in, or will be apparent from, the detailed description of preferred embodiments of the invention, which follows.

BRIEF DESCRIPTION OF THE DRAWINGS

FIG. 1a is a schematic side elevational view illustrating a step in a first preferred embodiment of the method of the invention;

FIG. 1b is a schematic side elevational view of a finished product resulting from the method of the embodiment of FIG. 1a;

FIG. 2a is a schematic side elevational view illustrating a step in an embodiment of the method of the invention;

FIG. 2b is a schematic side elevational view of a finished product resulting from the method of the embodiment of FIG. 2a;

FIG. 3a is a schematic side elevational view illustrating a step in an embodiment of the method of the invention;

FIG. 3b is a schematic side elevational view of a finished product resulting from the method of the embodiment of FIG. 3a;

FIG. 7b is a schematic side elevational view of a finished product resulting from the method of the embodiment of FIG. 7a;

FIG. 8a is a schematic side elevational view illustrating a step in an embodiment of the method of the invention;

FIG. 8b is a schematic side elevational view of a finished product resulting from the method of the embodiment of FIG. 8a;

DESCRIPTION OF THE PREFERRED EMBODIMENTS

Figure 1:
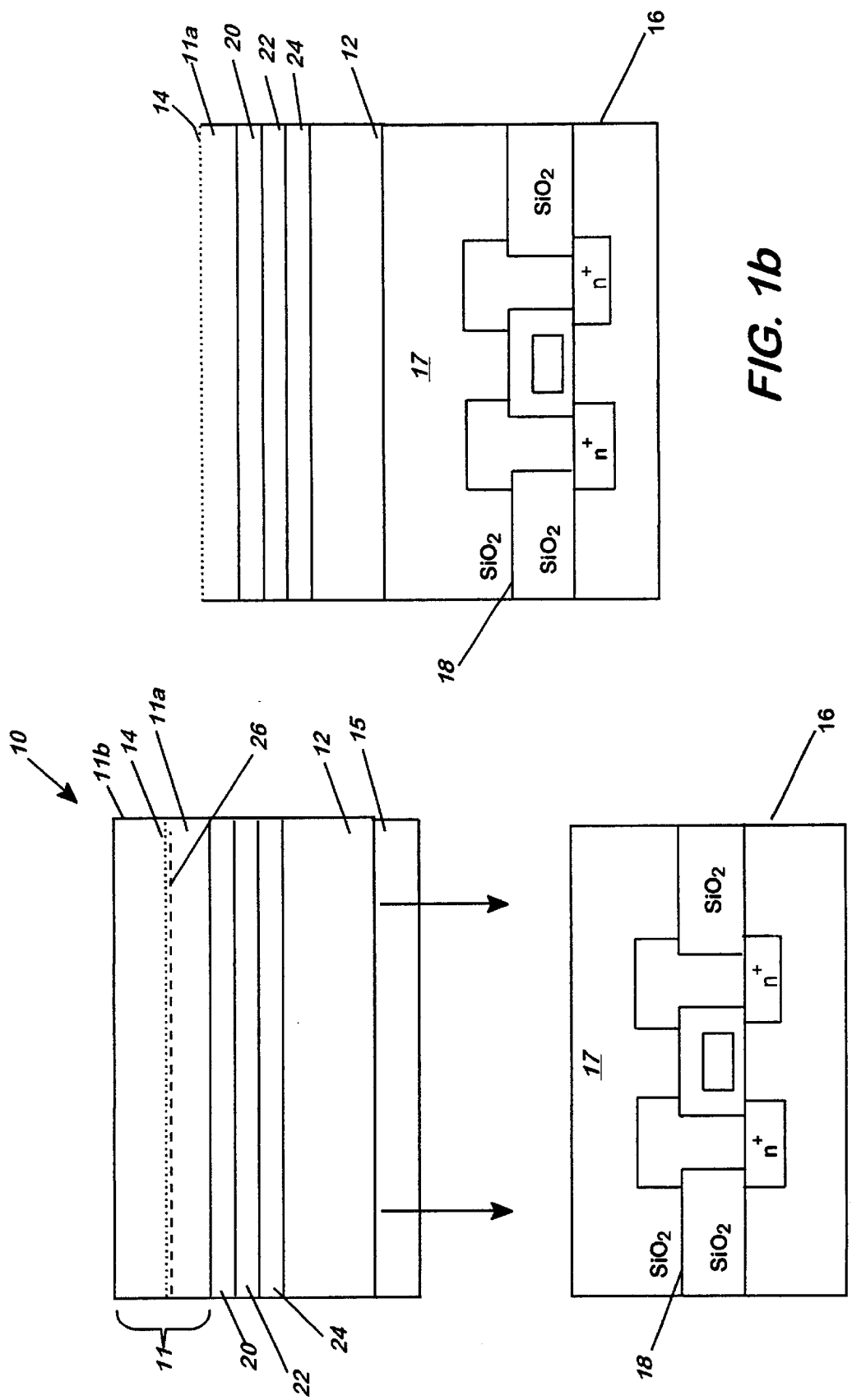

Preferred embodiments of the method will be discussed with reference to the drawings. Referring to FIG. 1a, the basic method of thin film layer transfer is shown which is fabrication of capacitors and pyroelectric sensor devices. A multi-layered construction 10 is shown at the top of the figure that is fabricated in a manner to be described. The fabrication process begins with a large diameter, first, or growth, substrate 11. A thin film layer of suitable material 12 is grown on the growth substrate 11. The thin film layer 12 can be grown using conventional methods known in the art such as sputter deposition, pulse laser deposition, sol gel techniques, MOCVD, MBE, CVD, or other suitable methods. After being grown, the thin film layer 12 can be annealed at 600° C. to 1100° C. for strengthening and tempering.

The growth substrate 11 is a large silicon, GaAs, sapphire, quartz or similar suitable material; as the meaning of the term "large diameter" is understood within the art. Of these potential growth substrate materials, the material of the most interest is silicon because large diameter silicon substrates can readily be obtained from silicon at low cost. Materials such as nanoparticles, ceramic powders, PZT, SrBaTiO3, PLZT, LiNbO2, SiGe, GaAs, CdTe/HgCdTe, ZnO and GaN are often used for thin film materials. When nanoparticles are used, they are sintered after deposition.

When silicon is used as the growth substrate material, and as indicated above, silicon is a preferred growth substrate material, some thin film materials such as PZT, $SrBaTiO_3$, PLZT, and $LiNbO_3$ typically would not be grown directly on the silicon growth substrate 11 due to the detrimental effects of reactions between the thin film layer 12 with the silicon of substrate 11. In such cases, as typified in this embodiment, the thin film layer 12 is grown on a protective layer 24 located between the thin film layer 12 and second substrate 16. Protective layer 24 preferably comprises a platinum layer or iridium layer.

An oxide layer 20 is grown on the silicon substrate 16. An adhesion layer 22, preferably titanium containing adhesion layer, is deposited on the oxide layer 20. The platinum or iridium layer 24 is deposited on the titanium adhesion layer 22. The oxide layer 20 insulates the silicon substrate 11, and the adhesion layer 22 facilitates bonding between the oxide layer 20 and the protective layer 24.

In one non-limiting example, a 250 nanometers thick $SrBaTiO_3$ ferroelectric film 11 was grown on a 100 nanometer thick platinum layer 24. The platinum layer 24 was grown on a 50 nanometers titanium layer 22. The titanium layer 22 was grown on a 100 nanometers silicon oxide film 20, which in turn was grown on the silicon substrate 11.

A hydrogen ion implant operation is carried out next. A hydrogen ion splitting layer 14, i.e. the peak of the hydrogen implant, is implanted at a suitable location within the multi-layer construction, preferably within the silicon growth substrate 11. For example, if a platinum or iridium protective layer 24 is present, the hydrogen implant will pass through the platinum or iridium film 24, the thin film layer 12 and other layers, with the peak of the dose residing in the silicon to thereby create the hydrogen implant splitting layer 14 located within the growth substrate 11, and dividing the growth substrate into portions 11a and 11b. The implant layer 14 is typically placed within the silicon substrate 11 to prevent damage to the protective layers or thin film layer 12 from splitting of the layer to be described herein. Optionally deposit material layer 15 and chemical mechanical polish (CMP) polish this material layer to obtain a small surface roughness that is suitable for direct wafer bonding. A surface roughness less than 1 nm rms is typically required for direct wafer bonding. The material layer to be deposited and CMP polished can include dielectric material, conductive material, metal layer, silicon oxide, silicon nitride, amorphous silicon, polysilicon, etc.

After completion of the multi-layered construction 10 shown at the top of FIG. 1a, this construction is bonded to a second substrate 16 shown at the bottom of figure 1a, which preferably contains CMOS or GaAs circuitry. In this embodiment, the second substrate 16 contains CMOS circuitry indicated at 18. Advantageously, the material layer 17 on the top surface of the second substrate 16 to be bonded is planarized before bonding using chemical-mechanical polishing for providing improved bonding.

There are numerous methods available for conducting the layer bonding. These bonding methods include conductive polymer adhesive bonding, organic adhesive bonding, reaction bonding, frit glass bonding, brazing, thermal compression bonding, ultrasonic bonding, vacuum bonding, anodic bonding, epoxy bonding, Au eutectic bonding, Ni eutectic bonding, direct bonding, and bump bonding.

After the bonding step is completed, hydrogen layer splitting is carried out at the splitting layer or ion implant peak 14, resulting in the separation of substrate part 11b from the remainder of the construction. Hydrogen layer splitting can be performed preferably by using one of two conventional methods. The first method involves heating. Such heating causes the hydrogen within the layer to expand and the expansion of the hydrogen layer 14 produced splitting of the growth substrate 11, and the separation of substrate portion 11b from the remainder of the construction 10.

Hydrogen layer splitting can also be carried out by directing a high-pressure gas stream towards the side of the wafer at the location of the hydrogen ion implant layer 14. The growth substrate 11 splits under the pressure of the high-pressure gas stream at the location of the hydrogen implant peak or splitting layer 14. This can be achieved even at room temperature. The high-pressure method thus can be used with polymer adhesives, which can typically be exposed to a maximum temperature of approximately 150° C. It is noted that there are other bonding materials which can withstand only a low temperature hydrogen layer splitting operation and thus can likewise be used with the high pressure gas initiated hydrogen implant layer splitting. These bonding materials include conductive polymer adhesives, silver paint, graphite paint, epoxy bonding material, soft solders, and indium cold welding material.

If heat is used to initiate the splitting, a lowered temperature for the splitting can be obtained by adding, in addition to the hydrogen implant layer 14, a boron implant layer 26 at the same location as the hydrogen implant layer 14. The boron layer 26, added to the hydrogen layer 14, decreases the splitting temperature of the layers. The lowest splitting temperature demonstrated for silicon is 200° C.–250° C. by using a combination of the hydrogen implant and the boron implant with the peak of both implants at the same location.

Referring to FIG. 1b, a finished product resulting from the steps of this embodiment is shown.

Figure 2:
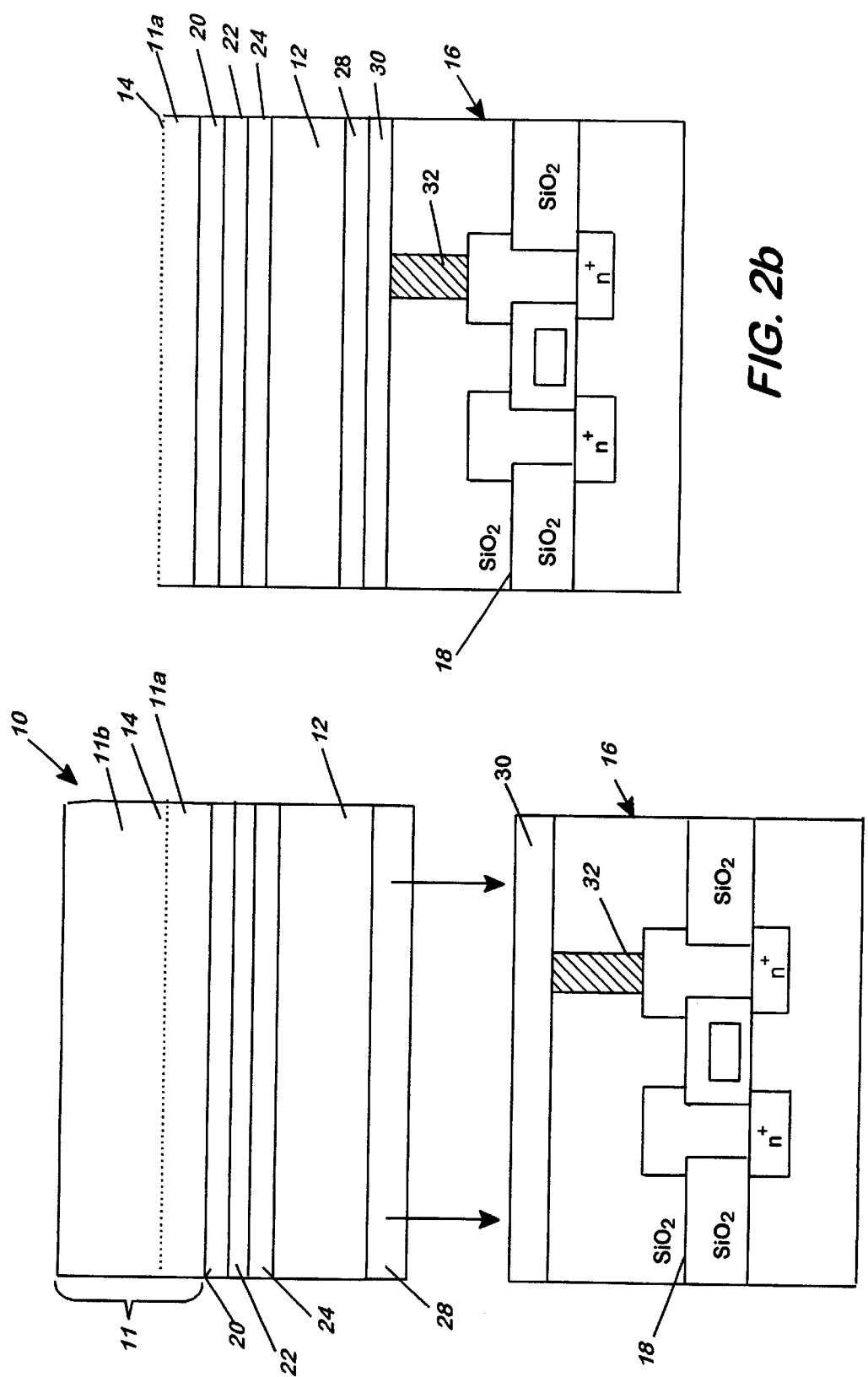

Turning to FIG. 2a, there is shown an embodiment that is a modification of the method described herein above. Because this embodiment and the remaining embodiments herein are similar to that of FIG. 1, corresponding elements have been given the same reference numerals. In this embodiment, a layer of metal 28 is deposited on the thin film layer 12 before the layered construction 10 is bonded to the second substrate 16. Typically, the metal of the metal layer 28 is either gold or nickel. A silicon layer 30 is provided at the surface of the second substrate 16. A metal connection 32 is fabricated between the CMOS circuitry 18 and the silicon layer 30. During the bonding step, the silicon layer 30 will be bonded to the nickel or gold layer 28.

In FIG. 2b, the finished product resulting from the steps of this embodiment, viz. a fabricated capacitor, is shown.

Figure 3:
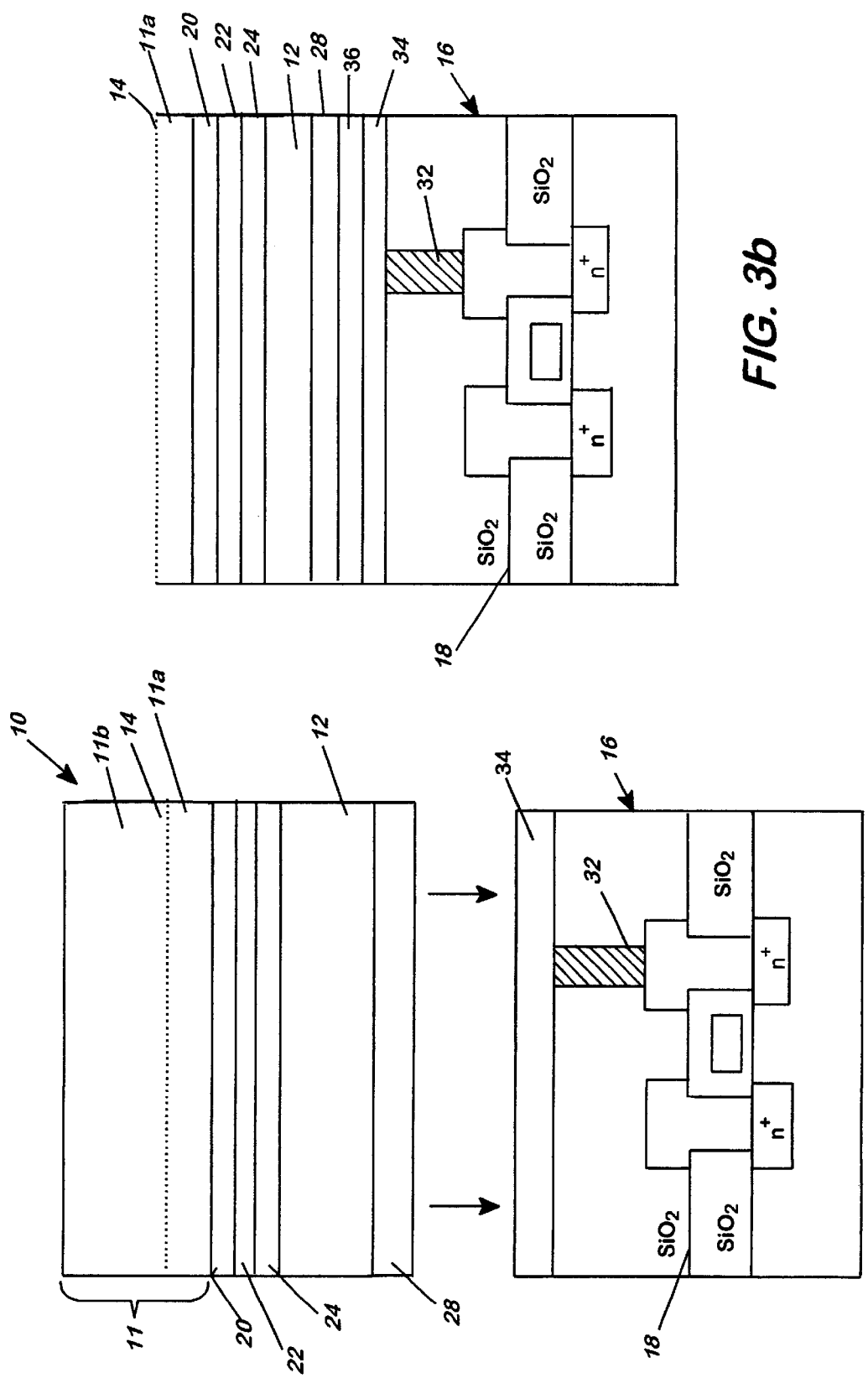

Referring to FIG. 3a, an embodiment that is a modification of the method herein is shown. A metal layer 34 is deposited on the surface of the second substrate 16 before bonding of the layered construction 10 to the second substrate 16. A layer of conductive adhesive material 36 is deposited so as to be between the metal layer 34 and the nickel or gold layer 28 during the bonding step.

Referring to FIG. 3b, the finished product resulting from carrying out the steps of this embodiment, viz. a fabricated capacitor, is shown.

Figure 4:
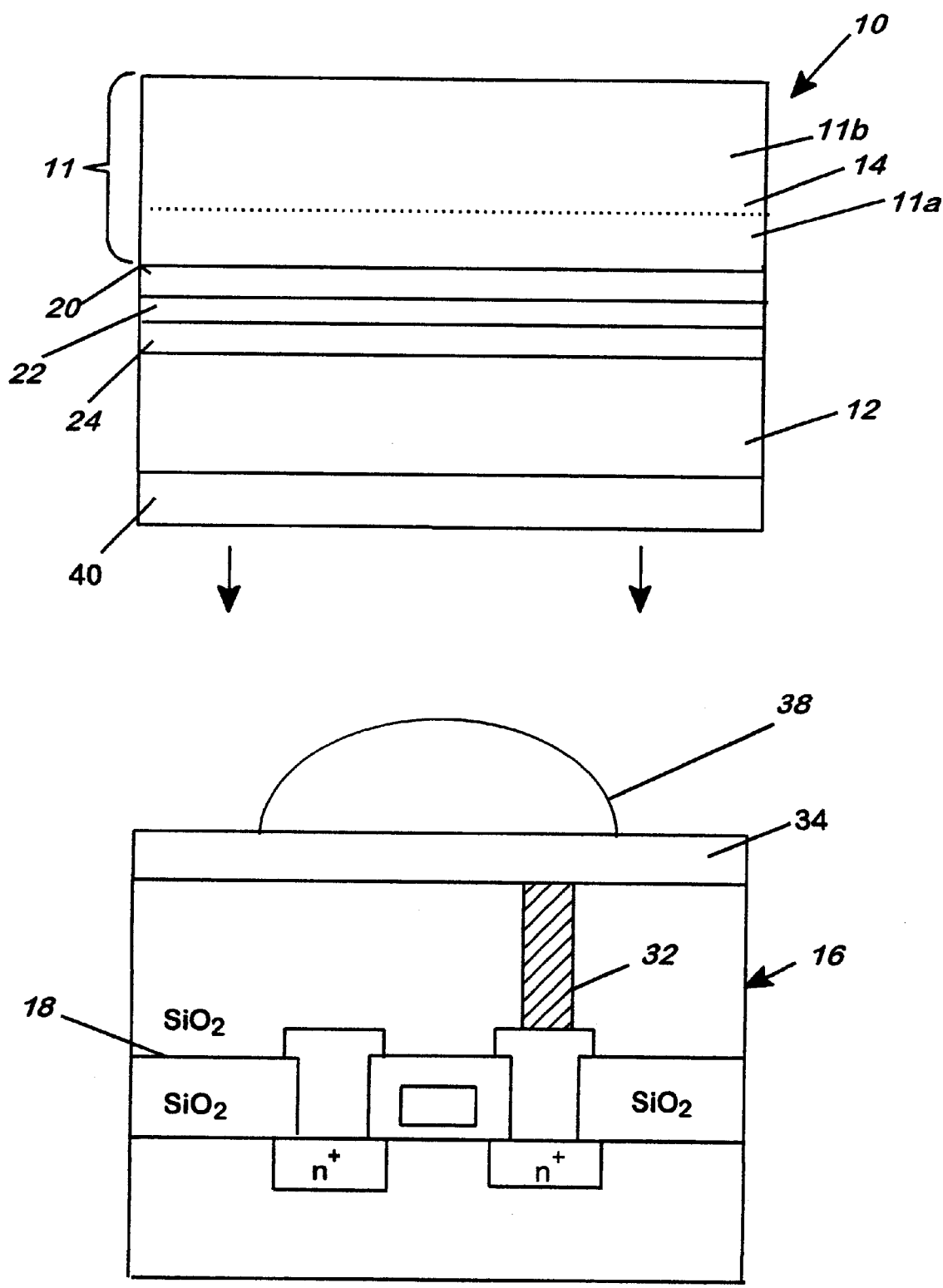
FIG. 4 is a schematic side elevational view illustrating a step in an embodiment of the method of the invention.

Referring to FIG. 4, an embodiment that is a modification of the method herein is shown. In this embodiment bump bonding is used for the bonding step. Bump bonding offers some advantages in the fabrication of capacitors. A portion of bump bond material 38 is deposited on the metal layer 34 over the second substrate 16. In this embodiment, the bump bond material 38 is a lead and tin composition. It is noted that the bump bond material 38 can be other suitable material such as a conductive polymer. The high-pressure method of implant splitting is typically used with the bump bonding technique because the lead and tin bump bond material can typically only be exposed to temperatures below 450° C.

The use of a bump bonding technique typically requires that a layer of stiffener material 40 be deposited on the thin film layer 12 before the bonding step. The stiffener layer 40 provides mechanical support for the thin film layer 12. In this embodiment, the stiffener material is a 20 um-thick layer of metal. Gold is often used as the stiffener material, but other suitable metals can be used.

Figure 5:
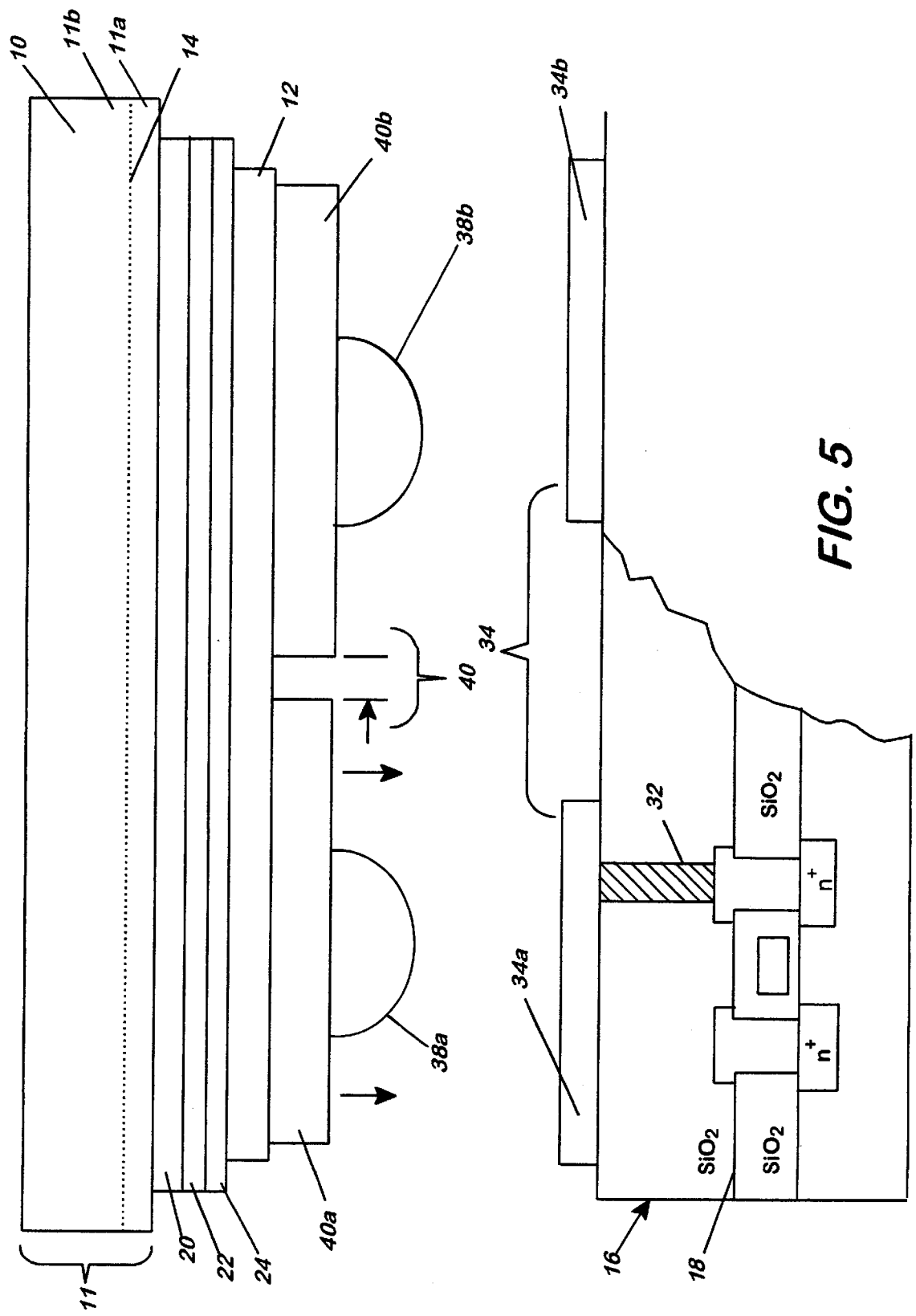
FIG. 5 is a schematic side elevational view illustrating a step in an embodiment of the method of the invention with a partial cutaway view of a CMOS substrate.

Referring to FIG. 5, an embodiment that is a modification of the embodiment of FIG. 4 is shown for fabricating a decoupling capacitor with floating top electrodes, wherein two capacitors are fabricated in series. The metal layer 34 deposited on the second substrate 16 is in two distinct portions, denoted 34a and 34b. A layer of 20 um-gold stiffener 40 is deposited on the thin film layer 12 and divided into two portions, denoted 40a and 40b. Two portions of bump bond material 38a, 38b are deposited onto the respective areas 40a, 40b of the stiffener layer 40. The portion of the second substrate showing repetitive material has been cut away for clarity.

Figure 6:
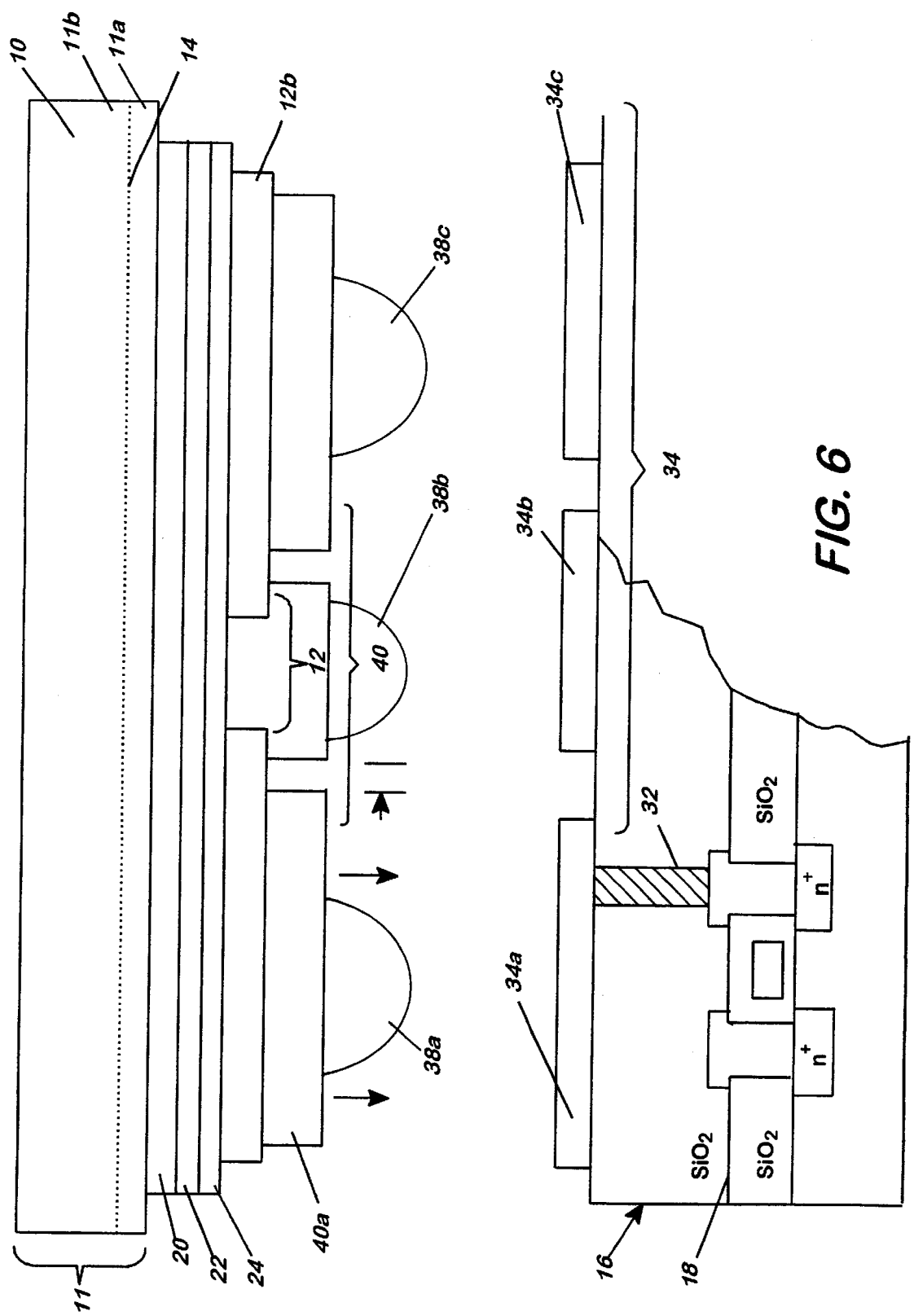
FIG. 6 is a schematic side elevational view illustrating a step in an embodiment of the method of the invention with a partial cutaway view of a CMOS substrate.

Referring to FIG. 6, an embodiment that is a modification of the embodiment of FIG. 5 is shown for fabricating a decoupling capacitor with top and bottom electrodes. The metal layer 34 deposited on the second substrate 16 is represented in three distinct portions, denoted 34a, 34b, and 34c. The thin film layer 12 is separated into two distinct portions, denoted 12a and 12b. The 20 um gold stiffener layer 40 is divided into three distinct portions, denoted 40a, 40b, and 40c. 40a and 40c are positioned over the respective pair of portions 12a and 12b of the thin film layer 12. Portion 40b is positioned over the gap between the thin-film layer portions 12a and 12b, and is in contact with the platinum or iridium layer 24. Repetitive material in the second substrate has been cut away for clarity.

Figure 7A:
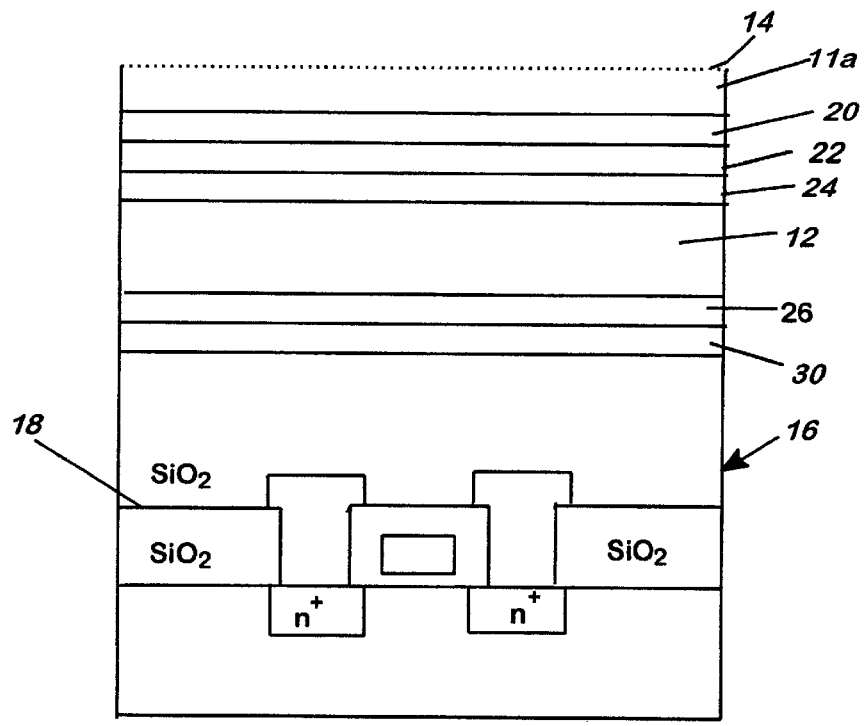
FIG. 7a is a schematic side elevational view illustrating a step in an embodiment of the method of the invention.
Figure 7B:
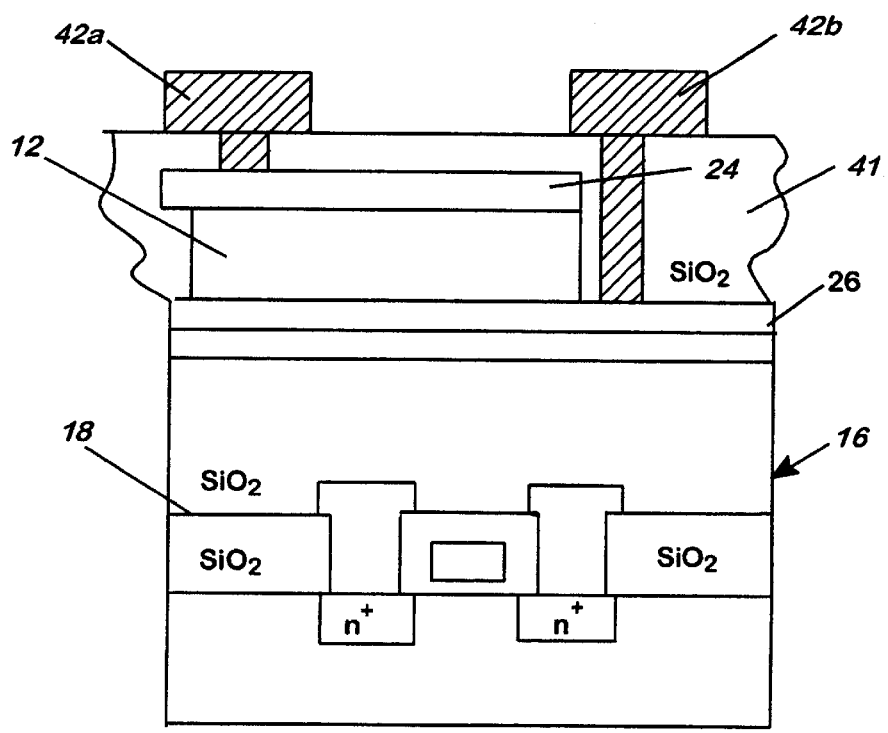

Turning to FIGS. 7a and 7b, a further embodiment of the method of the invention is shown. In FIG. 7a, bonding between the nickel, palladium, platinum, or gold metal layer 28 and a silicon layer 30 deposited on the second substrate 16 is completed. The silicon layer 30 can be CMP polished to obtain a small surface roughness suitable for direct wafer bonding.

In FIG. 7b, the adhesion layer 22, the oxide layer 20 and the remaining silicon from the growth substrate 11a, are removed. Preferably, the removal is performed by etching. A portion of the thin film layer 12 and the platinum or iridium layer 24 can be removed as well. Alternately, instead of removing the platinum or iridium layer, electrical contact can be made to layer 24 to form the top electrode of the capacitor. Alternately, a conductive layer can be deposited on the surface of the thin film layer 12 to form the top electrode of a capacitor. A layer of a suitable material 41, silicon oxide in this embodiment, is deposited to replace the removed layers and removed portions of layers. Contacts 42a and 42b are fabricated between the platinum/iridium layer 24 and the surface, and the gold or nickel layer 28 and the surface, respectively. Typically, photolithography can be carried out to fabricate the contacts connected to the platinum/iridium layer and to the nickel or gold layer 28. These steps result, as shown, in a fabricated capacitor with topside contact to the electrodes.

Referring to FIG. 8a, a further embodiment of the thin layer transfer method of FIGS. 1a–1b is shown. An MgO buffer layer 44 is deposited on the growth substrate 11, and the thin film layer 12 is deposited on the MgO layer 44. The MgO layer is used as a buffer layer instead of the platinum or iridium layer 24, adhesive layer 22 and oxide layer 20 shown in other embodiments disclosed herein. If the MgO layer 44 is sufficiently thick, the hydrogen layer 14 can be implanted within the MgO layer 44 instead of the growth substrate 11. In this embodiment, the implant layer 14 is within the growth substrate 11.

In FIG. 8b, the finished product resulting from the steps of the embodiment of FIG. 8 is shown.

Figure 9:
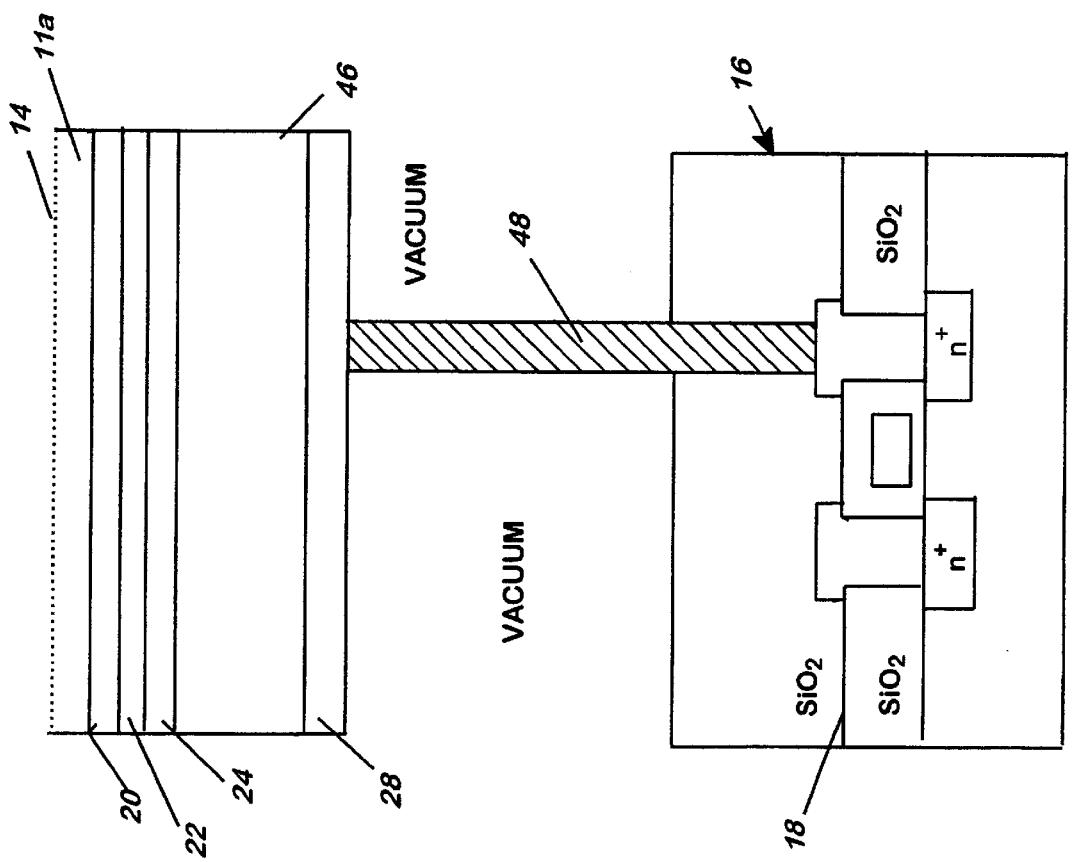
FIG. 9 is a schematic side elevational view of a finished product resulting from an embodiment of the method of the invention.

Referring to FIG. 9, a further embodiment of the invention is shown. In this embodiment, a pyroelectric thin film layer 46 is grown as described above in connection with previous embodiments in growing the thin film layer 12. In this embodiment, as in previous embodiments, the substrate 16 from which the sensor will be fabricated is a CMOS circuitry containing substrate. In fabricating a device such as a pyroelectric sensor, it is desirable to maximize the thermal impedance between the bottom electrode 28 and the CMOS circuitry 18. To that end, a long connection 48 is provided between the CMOS circuitry 18 and the metal layer 28 deposited on the thin film layer. Preferably, the connection 48 is comprised of amorphous silicon. The area between the bottom electrode 28 and the surface of the second substrate 16 is placed in vacuum to further increase the thermal impedance between the CMOS circuitry 18 and the functional layers of the pyroelectric device. Preferably, the pyroelectric thin film layer 46 is comprised of a sintered ceramic material such as PZT or PZLT. It is noted that other suitable materials, though less preferred, can be used.

Figure 10:
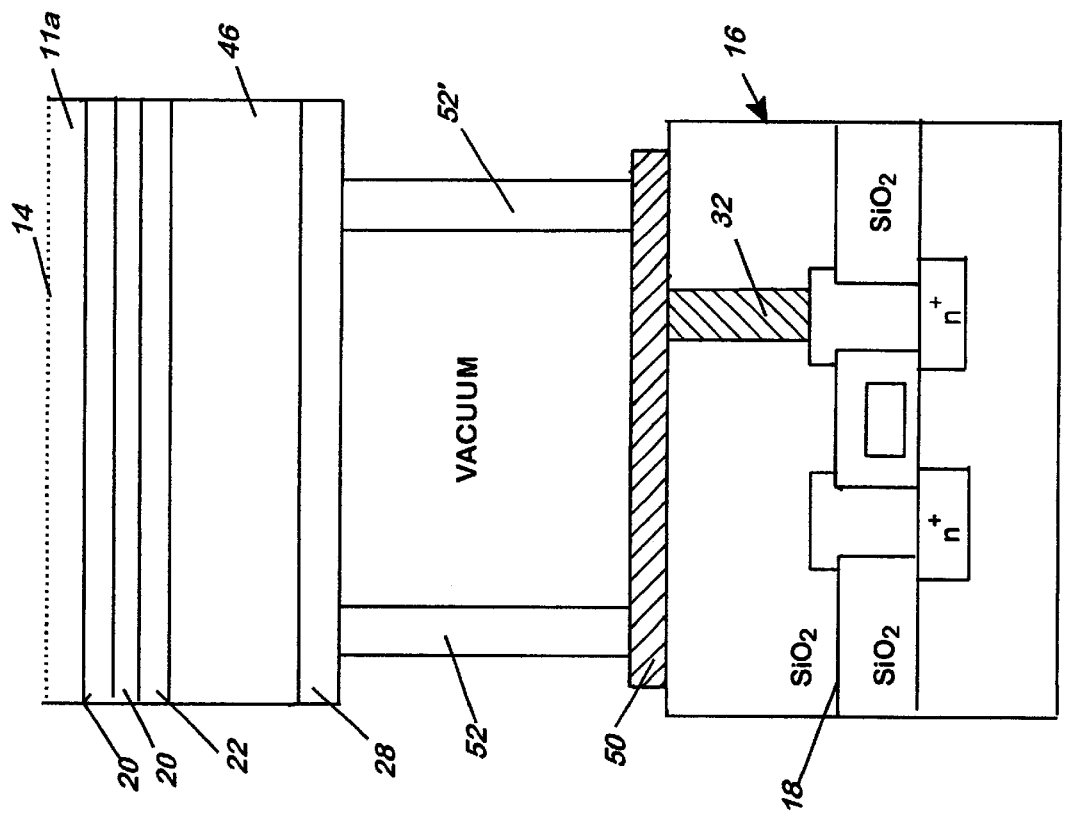
FIG. 10 is a schematic side elevational view of a finished product resulting from an embodiment of the method of the invention.

Turning to FIG. 10, another embodiment is shown which is a modification of the method of FIG. 9. In this embodiment, similarly to previous embodiments, a connection 32 is provided connecting the CMOS circuitry 18 to the surface of the second substrate 16. In contrast to the other embodiments, a thin conductive layer 50 is deposited on the surface of the second substrate and at least one pair of posts 52 are provided between the conductive layer 50 and the nickel or gold metal layer 28 on the thin film layer 12. Preferably, the posts 52 are made of a material that is electrically conductive but has a low thermal conductivity so as to maximize thermal impedance between the metal layer 28 and the thin conductive layer 50. The posts 52 are preferably comprised of conductive epoxy, InSnO, or amorphous silicon. As in the embodiment of FIG. 9, a vacuum is provided between the second substrate 16 and the metal layer 28 for the purpose of maximizing thermal impedance. The use of the posts 52 provides an alternative approach to that of the embodiment of FIG. 9 in providing thermal impedance isolation in fabricating a pyroelectric sensor.

Figure 11:
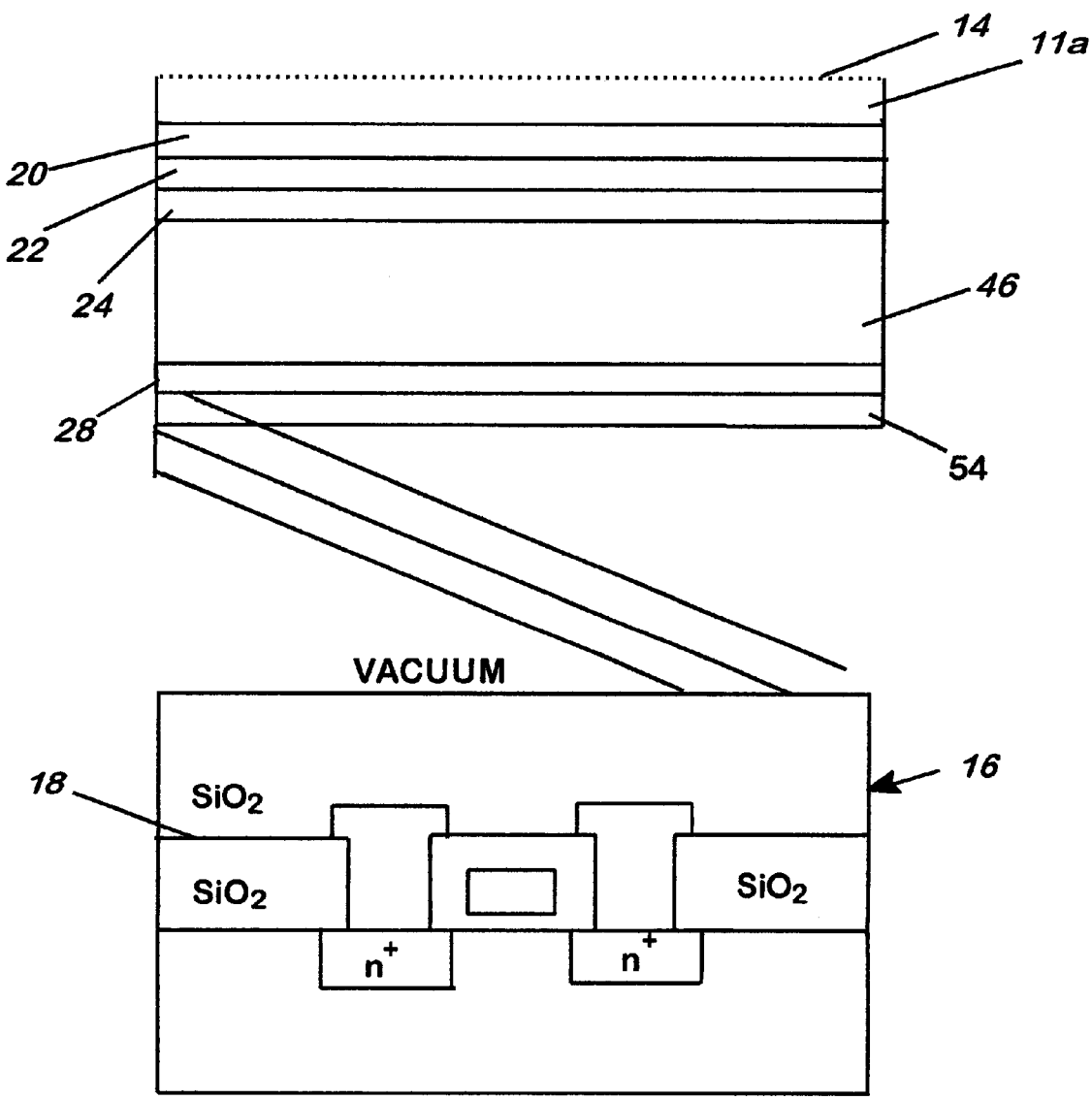
FIG. 11 is a schematic side elevational view of a finished product resulting from an embodiment of the method of the invention.

Referring to FIG. 11, another embodiment of the fabrication method of the invention is shown. In this embodiment, a layer of nitride 54 is deposited over the gold or nickel metal layer 28. As indicated herein, it is important to maximize the thermal impedance, and thus isolation, beneath the capacitor element. Typically, dielectric is removed from the bottom of the nitride layer or membrane 54. In FIG. 11, the dielectric has already been removed. If one or more polysilicon electrodes (not shown) are present in any of the pyroelectric sensor embodiments herein, the dielectric beneath the polysilicon electrode is removed by dilute HF etching. The HF etching is carried out before the bonding step between the thin film layer 12 and associated layers, and the second substrate 16. Alternatively, the HF etching is carried out with great care after detector elements have been formed.

The thin film layer 12 and associated layers are tilted to provide a small area of contact between the thin film layer 12 and associated layers and the second substrate 16 while maintaining high thermal impedance. A vacuum is maintained over the surface of the second substrate to maximize thermal impedance. These steps result in the fabrication of a pyroelectric sensor.

Although the invention has been described above in relation to a preferred embodiment thereof, it will be readily understood by those skilled in the art that variations and modifications can be effected without departing from the scope and spirit of the invention.

What is claimed is:

1. A method for making a pyroelectric sensor, comprising the steps of:

(a) depositing at least one protective layer on the surface of a growth substrate;

(b) growing a layer of pyroelectric thin film functional material on the at least one protective layer;

(c) implanting hydrogen to a selected depth within the growth substrate or within the at least one protective layer to form a hydrogen ion layer so as to divide the material having the growth substrate and the at least one protective layer into distinct portions;

(d) depositing at least one layer of metal on the pyroelectric thin film layer;

(e) providing a conductive connection between the material having the thin film layer, and a second substrate, the second substrate comprises circuitry; and (f) splitting the material having the growth substrate and the at least one protective layer along the implanted ion layer and removing the portion of the material which is on the side of the ion layer away from the second substrate wherein step (e) is carried out by fabricating a conductive connection between the second substrate circuitry and the second substrate surface;

depositing a conductive layer on the surface of the second substrate, wherein the conductive layer is in contact with the conductive connection; and fabricating at least one post extending from the conductive layer to the metal layer of step (c) for thermally insulating the CMOS or GaAs circuitry from the thin film pyroelectric layer, and wherein the at least one post comprises a material selected from one of a group consisting of a conductive epoxy, amorphous silicon, and InSnO.

\* \* \* \* \*